(12) United States Patent
Tour et al.

(10) Patent No.: US 7,704,323 B2
(45) Date of Patent: Apr. 27, 2010

(54) METAL-FREE SILICON-MOLECULE-NANOTUBE TESTBED AND MEMORY DEVICE

(75) Inventors: James M. Tour, Bellaire, TX (US); Jianli He, Houston, TX (US); Bo Chen, Sugar Land, TX (US); Austen K. Flatt, Houston, TX (US); Jason J. Stephenson, Humble, TX (US); Condell D. Doyle, Nocona, TX (US)

(73) Assignee: William Marsh Rice University, Houston, TX (US)

( * ) Notice: Subject to any disclaimer, the term of this patent is extended or adjusted under 35 U.S.C. 154(b) by 531 days.

(21) Appl. No.: 11/337,456

(22) Filed: Jan. 23, 2006

(65) Prior Publication Data

US 2007/0111486 A1   May 17, 2007

Related U.S. Application Data

(60) Provisional application No. 60/645,814, filed on Jan. 21, 2005.

(51) Int. Cl.
*C30B 21/02* (2006.01)
(52) U.S. Cl. .............................. 117/84; 117/90; 117/95; 117/96
(58) Field of Classification Search .................. 117/84, 117/90, 95, 96
See application file for complete search history.

(56) References Cited

U.S. PATENT DOCUMENTS

| | | | |
|---|---|---|---|
| 6,855,950 B2* | 2/2005 | McCreery | 257/40 |
| 2004/0104129 A1* | 6/2004 | Gu et al. | 205/775 |
| 2005/0012163 A1* | 1/2005 | Wei et al. | 257/407 |

* cited by examiner

*Primary Examiner*—Robert M Kunemund
(74) *Attorney, Agent, or Firm*—Winstead PC

(57) ABSTRACT

Work from several laboratories has shown that metal nanofilaments cause problems in some molecular electronics testbeds. A new testbed for exploring the electrical properties of single molecules has been developed to eliminate the possibility of metal nanofilament formation and to ensure that molecular effects are measured. This metal-free system uses single-crystal silicon and single-walled carbon nanotubes as electrodes for the molecular monolayer. A direct Si-arylcarbon grafting method is used. Use of this structure with π-conjugated organic molecules results in a hysteresis loop with current-voltage measurements that are useful for an electronic memory device. The memory is non-volatile for more than 3 days, non-destructive for more than 1,000 reading operations and capable of more than 1,000 write-erase cycles before device breakdown. Devices without π-conjugated molecules (Si—H surface only) or with long-chain alkyl-bearing molecules produced no hysteresis, indicating that the observed memory effect is molecularly relevant.

20 Claims, 7 Drawing Sheets

METAL-FREE SILICON-MOLECULE-NANOTUBE TESTBED AND MEMORY DEVICE

RELATED APPLICATION DATA

Pursuant to 35 U.S.C. §119, this application claims the priority of prior provisional application Ser. No. 60/645,814, filed on Jan. 21, 2005, which application being hereby incorporated by reference herein in its entirety.

STATEMENT REGARDING FEDERALLY SPONSORED RESEARCH OR DEVELOPMENT

The research and development related to this invention was funded at least in part by the U.S. Defense Advanced Research Projects Agency through the Air Force Office of Scientific Research.

FIELD OF THE INVENTION

The present invention is directed generally to the field of molecular electronics, and more particularly to metal-free silicon-molecule-nanotube systems.

BACKGROUND OF THE INVENTION

Speculation that silicon-based semiconductor manufacturing processes will encounter a miniaturization limit has led to a large research effort in molecular electronics, where molecular monolayers are used as active switching components. In the case of active devices, in particular, wherein current is driven through the molecules, two-terminal molecular switches have been the subject of much research, with switching behavior reported for several systems. However, there are perceived uncertainties about the switching mechanisms, the local environment, as well as temperature, which can potentially affect the conduction through molecular junctions.

Whereas organic films deposited from solution or by sublimation have been used in organic field-effect transistors with some success, such devices are not molecular-monolayer based. In most molecular-monolayer-based systems, the molecules being tested are first self-assembled onto a metallic electrode and then a second metal electrode is evaporated on top of them to create a metal-molecular-monolayer-metal sandwiched device.

Several persistent problems arise in these ultrathin sandwich structures. First, as the top electrode is vapor-deposited onto the self-assembled monolayer, energetic metal atoms can degrade the molecules. Second, the metal often penetrates the molecular monolayer to form metallic current paths, thereby short circuiting the device.

Owing to pinhole defects in the self-assembled monolayer, this problem can remain even upon cryogenic cooling during the top-metal evaporation step. For other approaches, such as the mercury-drop top-contact or scanning-probe-microscopy methods, it is believed to be unlikely that metal nanofilaments form when the device is first assembled, and consistent results have been recorded in these systems. However, there are cases when a voltage is applied during the testing where electrode melting occurs; therefore, even if metallic nanofilaments are not initially formed, they can result upon use of the device. The formation of metal nanofilaments can be confused with molecular switching, and current-voltage-temperature (I(V, T)) measurements are needed to distinguish the molecular versus metallic nanofilament switching mechanisms.

In sum, it has been demonstrated in the prior art that metal nanofilaments cause problems in some molecular electronics testbeds.

SUMMARY OF THE INVENTION

In view of the foregoing considerations, the present invention is related to a method for testing molecules with a testbed structure containing two oxide-free non-metallic electrodes in order to eliminate the possibility of metal-filament formation and to reveal the molecular effects. Then, with u-conjugated molecular structures, a hysteresis can be observed that can serve as a molecular electronic memory.

In one aspect, the present invention is directed generally to a method of making reliable electrical contacts to molecules for the purposes of creating a testbed for testing and utilizing, the electronic properties of the molecules. In one embodiment, the invention features the deposition of carbon nanotubes atop a molecular layer to form the top electrical contact (electrode), instead of the prior art method of forming the top contact via physical vapor deposition (PVD) of a metal or deposition of metal nanoparticles. By practicing the present invention, molecules can be reliably connected to the bottom and top electrodes, and their electronic behavior can be determined by the corresponding testing. The formation of metal filaments, a common but undesirable phenomenon when metal contacts are used, advantageously does not occur in accordance with the teachings of the present disclosure. It is also believed that the present invention will not require molecular layers to be as dense and closely packed as in other processes.

In accordance with another aspect of the invention, a metal-free system uses single-crystal silicon and single-walled carbon nanotubes (SWNTs) as electrodes for the molecular monolayer. A direct Si-arylcarbon grafting method is used. Use of this structure with π-conjugated organic molecules results in a hysteresis loop with current-voltage measurements that are useful for an electronic memory device. The memory has been shown to be non-volatile for more than three days, non-destructive for more than 1,000 reading operations and capable of more than 1,000 write-erase cycles before device breakdown. Devices without π-conjugated molecules (Si—H surface only) or with long-chain alkyl-bearing molecules produced no hysteresis, indicating that the observed memory effect is molecularly relevant.

BRIEF DESCRIPTION OF THE DRAWINGS

The foregoing and other aspects of the invention will be further appreciated by reference to the following description of detailed descriptions of preferred embodiments of the invention, when read in conjunction with the accompanying drawings, wherein.

DETAILED DESCRIPTION OF SPECIFIC EMBODIMENTS OF THE INVENTION

In the following description, specific parametric details are set forth, including specific quantities, sizes, materials, properties, and the like, so as to provide a thorough understanding of the present invention. However, it will be readily apparent to those of ordinary skill in the art that the present invention may be practiced while deviating to varying extents from specifically detailed parameters. In many cases, details concerning certain features and parameters of the invention have been omitted, inasmuch as such details are not believed to be necessary to obtain a complete understanding of the present invention and are within the skills of persons of ordinary skill in the relevant art.

Figure 1:
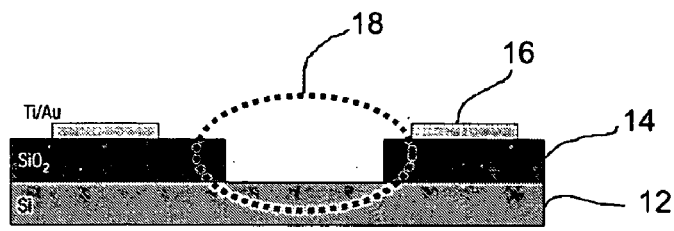
FIG. 1 is a side cross-sectional view of a lithographically-defined structure in accordance with one embodiment of the invention.
Figure 2:
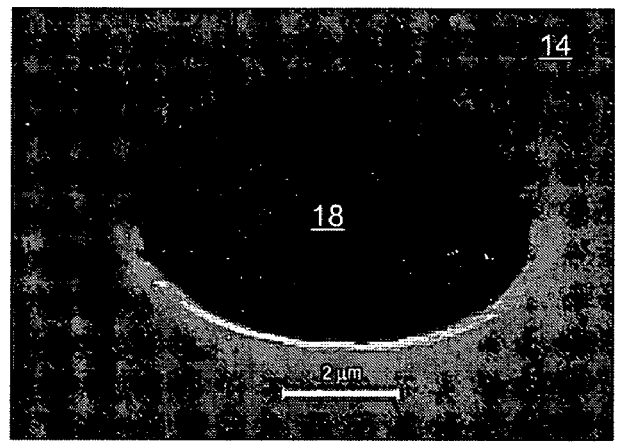
FIG. 2 is a scanning electron-microscope top view image of a 5μ well in the structure of FIG. 1 showing its ramped oxide edges.

Referring to FIG. 1, there is shown the starting lithographically defined structure of a silicon-molecule-SWNT device 10 in accordance with one embodiment of the invention. As shown in FIG. 1, structure 10 comprises a silicon substrate 12 upon which is formed an oxide layer 14 having a well 18 formed therein. Atop the oxide layer 14 are aluminum contacts 16. FIG. 2 is a top-view scanning electron microscope image of device 10 from FIG. 1.

Figure 3:
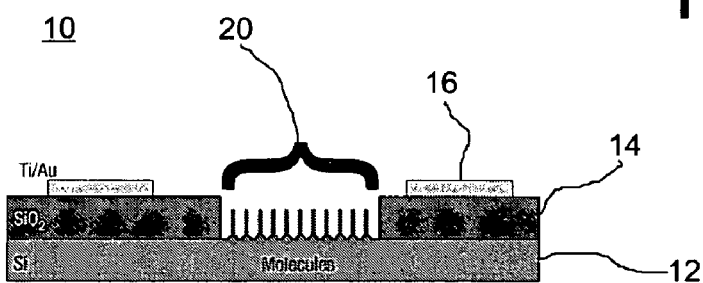
FIG. 3 is a side cross-sectional view of the structure of FIG. 1 after formation of a molecular monolayer in the well by surface grafting to form a direct silicon-arylcarbon bond.

In a preferred embodiment, and as shown in FIG. 3, molecules are grafted to the H-passivated silicon substrate 12 to form a monolayer 20 in a well 18 made through the silicon oxide layer 14. The molecules comprising monoloyer 20 are directly bound to the Si substrate 12 by a Si—C bond, with no intervening oxide. FIGS. 4a through 4f show exemplary structures of the molecules 20 specifically discussed in this disclosure, although those of ordinary skill in the art will understand that FIGS. 4a through 4f are by no means exhaustive of the molecular structures relevant to the concepts embodied in the present invention. When assembled, the diazonium group is lost from each molecule and a direct Si—C bond is formed. For the α,ω-bisdiazonium salt shown in FIG. 4d, the distal diazonium group is not stable, and is lost shortly after the first aryl attachment to the silicon substrate 12.

Figure 5:
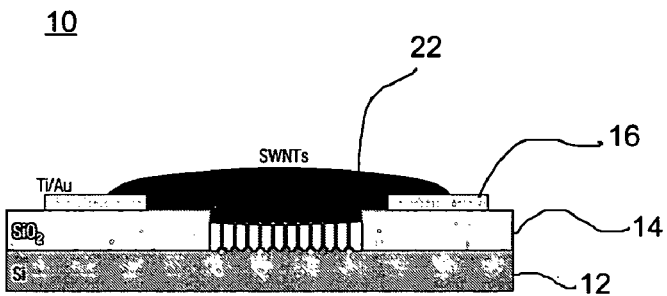
FIG. 5 is a side cross-sectional view of the structure of FIG. 1 following deposition of a single-wall carbon nanotube (SWNT) mat on top of the molecules across the well, electrically connecting the molecular layer to metal pads.
Figure 6:
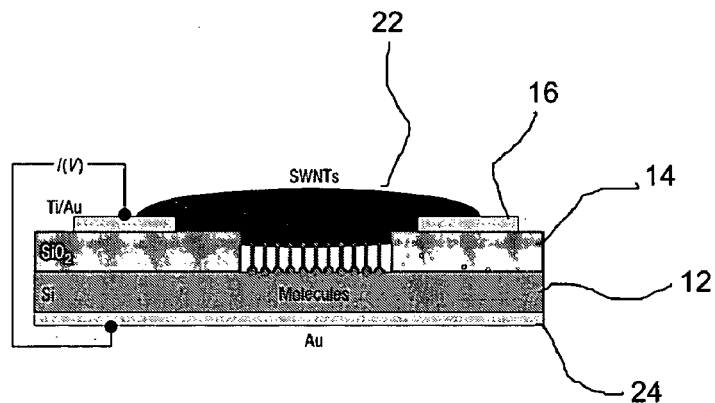
FIG. 6 is side cross-sectional view of the structure from FIG. 1 after formation bottom-side aluminum contacts and showing the current-voltage (IV) path described in this disclosure.
Figure 7:
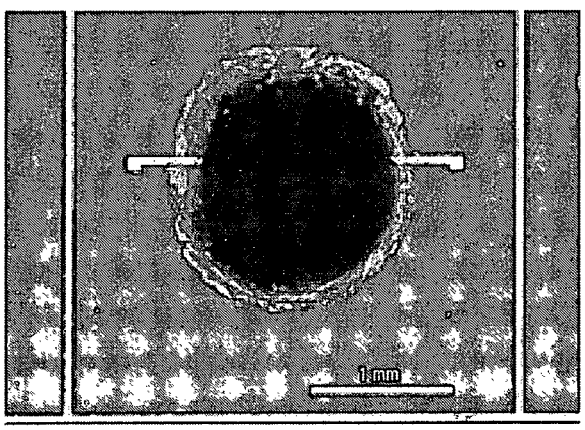
FIG. 7 is a scanning electron microscope image of the structure from FIG. 1 where single-wall carbon nanotubes drape across the aluminum contacts and the molecular layer in the well, the latter being a minute portion in the center of the image that is not visible owing to the single-wall carbon nanotube mat and the resolution of the image.

Referring to FIG. 5, A SWNT mat 22 is formed is in contact with the metal pad 16. SWNT mat 22 is designed to be larger than the area of the SWNT mat 22 that is actually in contact with the well-contained molecular layer 20. The SWNTs used to bridge the grafted molecules include pristine SWNTs and SWNTs slightly functionalized with 4-tetradecylphenylene moieties. The slight functionalization may be done to improve the SWNT dispersibility in chloroform. Both the pristine and functionalized SWNTs have been separately tested and have generally been shown to have relatively low resistance by four-point probe analysis at room temperature (0.05 Ω cm for pristine SWNTs and 0.43 Ω cm for slightly functionalized SWNTs). The resistance of SWNTs together with the metal pads 16 has been measured to be less than 100Ω, whereas the total resistance from an assembled structure is typically greater than 10 kΩ. Therefore, the series resistance from the SWNT-metal pad junction is negligible, and any I/(V) characteristics of the assembly are due solely to the Si-molecule-SWNT junction.

Both the pristine and functionalized SWNTs yield similar electronic characteristics in the final device. In addition to the metal-free active-device area, a system in accordance with the present invention has another advantage. Whereas the individual nanotubes are ~1 nm in diameter and 100-500 nm in length, the SWNT ropes used are typically 5-15 nm in diameter and 1-3 μm in length. This large aspect ratio makes it more probable that the SWNTs 22 will be deposited parallel to the Si surface 12 and on top of the molecular monolayer 20, instead of jutting into the layer of molecules and perhaps puncturing it. Therefore, even if the grafted layer has some small pinholes or boundary vacancy defects, as most monolayers have, the SWNTs 22 are able to deliver an effective connection to the top of the grafted molecular layer 20 without shorting to the bottom electrode. The top contact is believed to be through a co-facial π-overlap between the SWNTs 22 and the aryl rings of the grafted layer 20. When smaller wells are made with 2-μm diameters, the yields of open devices increases substantially, presumably because of the inability of the SWNT ropes to dip down into the 200-nm-deep well structure and contact any significant portion of the assembled molecules.

Finally, the metal contact pads 16 for the SWNTs are far enough (e.g., 300 μm) from the well 18 that mitigation of shorting, by electrode melting into the well, is ensured. A last concern about possible metal-filament behavior in this system is the residual metallic catalyst materials used in the SWNT synthesis. The SWNTs used are preferably produced by a high-pressure CO disproportionation process where Fe forms nanosized metallic clusters that act as catalysts for SWNT growth. However, the residual Fe is adequately removed by a subsequent purification procedure, as would be understood by those of ordinary skill in the art. By a thorough cleaning procedure, the concentration of residual Fe is less than 2 wt % and is carbon-encapsulated because it escapes dissolution in concentrated HCl, and thus is unlikely to form a nanofilament.

Figure 4A:
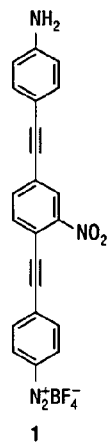
FIGS. 4a through 4f depict exemplary molecular structures used in a Si-molecule-SWNT device in accordance with alternative embodiments of the invention.
Figure 4B:
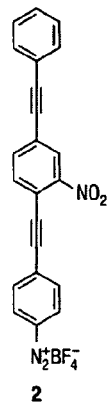
Figure 4C:
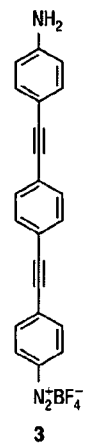
Figure 4D:
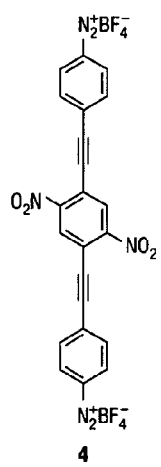
Figure 8A:
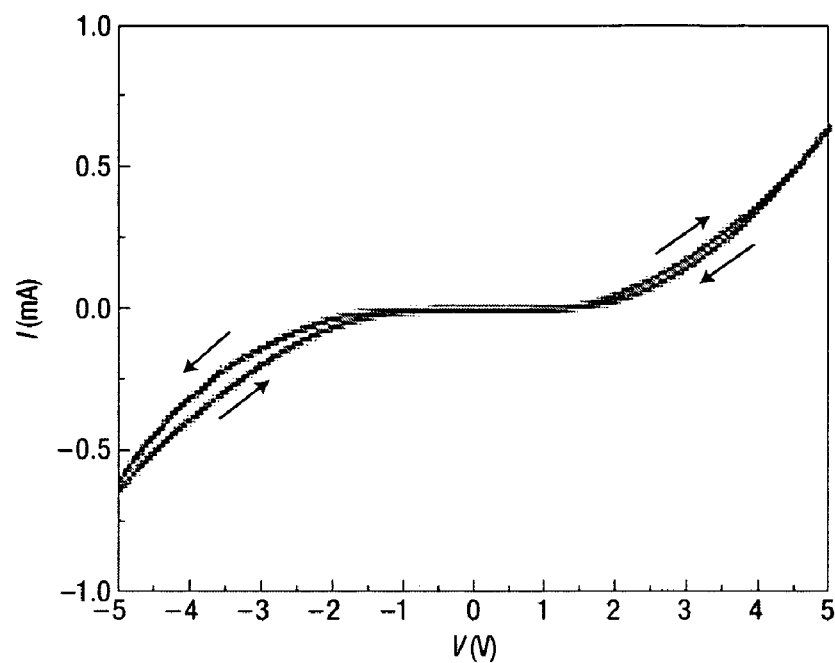
FIGS. 8a and 8b are (I/V) plots of the electrical properties of the structure from FIG. 3 corresponding to the presence of molecular and non-molecular layers in the well.
Figure 8B:
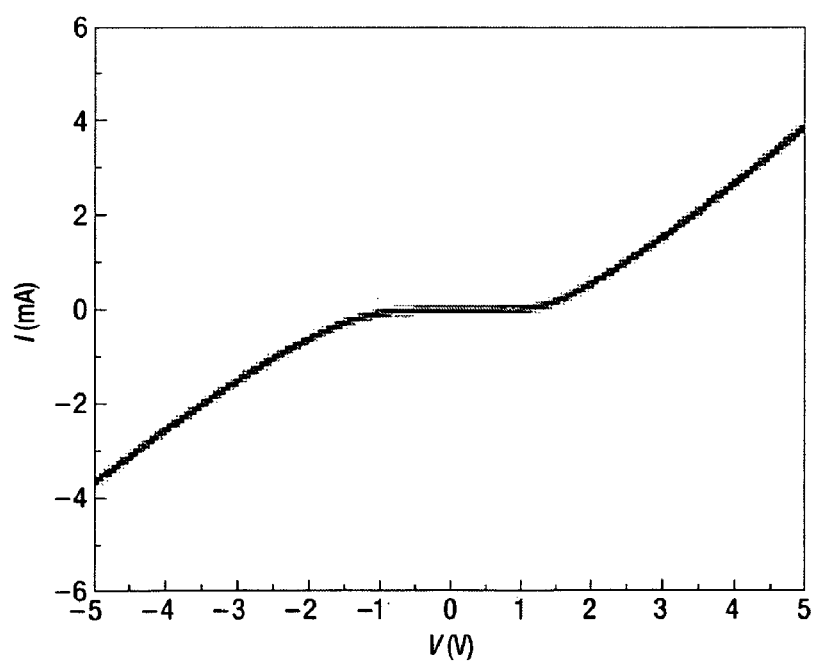

FIG. 8a shows an I(V) curve from Si-molecule-SWNT device 10 when the molecular layer 20 was made in a 15-μm diameter well from oligo(phenyleneethynylene), or OPE, as shown in FIG. 4a. The positive, bias in FIG. 8a corresponds to positive voltages applied to the top metal pad 16, whereas negative bias corresponds to negative voltages applied to the top pad 16, both relative to the bottom Si substrate 12. The arrows in FIG. 8a show the sweep directions. FIG. 8b shows the I/(V) characteristics for a device similar to device 10 but having no molecular layer, i.e., Si—H-SWNT within the same sized well.

Figure 9A:
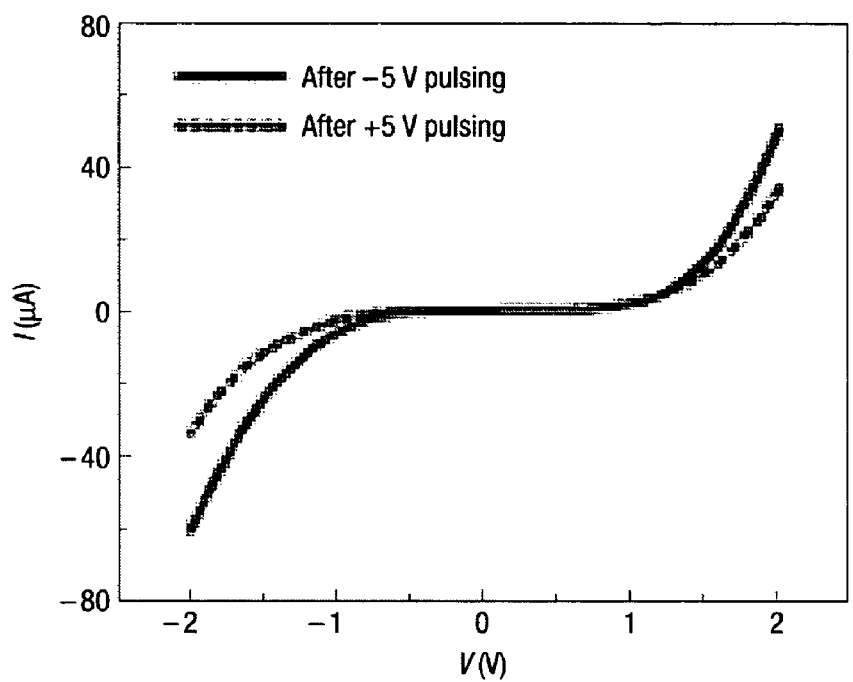
FIG. 9a is an (I/V) plot of the electrical properties of the structure from FIG. 3 before and after pulsing with −5V and +5V voltages ranging between approximately −2V and +2V.

As can be seen in FIG. 8*a*, a significant feature in the I/(V) curve is the nonlinear hysteresis loop (expanded in FIG. 9*a*). For the purposes of the present disclosure, the convention of the change in the area under the I/(V) curve between two scan directions is used to quantify the hysteresis magnitude (that is, the area change divided by the area when swept from 0 V). In an experimental embodiment, a hysteresis as much as 32% has been demonstrated for assemblies formed from OPE shown in FIG. 4*a*. The hysteresis is not symmetric. The negative bias region tends to show larger current and hysteresis. The curve in FIG. 8*a* is representative of all the I(V) curves measured from devices made with π-conjugated molecules (FIGS. 4*a* through 4*e*) with little difference in their position and magnitude. Of the many devices made and tested by the inventors, about 80% showed similar I(V) behavior, whereas the other 20% showed either no hysteresis loop or they were open circuits. Negative differential resistance was never observed.

In contrast, control samples containing no assembled molecules in the well 18, that is, only a Si—H surface, never showed hysteresis in the I(V) measurements. The I(V) curves from such a Si—H device with a 15-µm-diameter well are shown in FIG. 8*b*. In addition, devices made from an assembly of the arylalkane shown in FIG. 4*f* never produced a hysteresis loop in the I(V) measurements. These results indicate that the observed hysteresis is indeed a molecular-based effect. However, unlike metal-based testbeds, the molecule type, as long as it has π-conjugation, seems to make little difference in the magnitude or location of the resulting hysteresis.

Figure 9B:
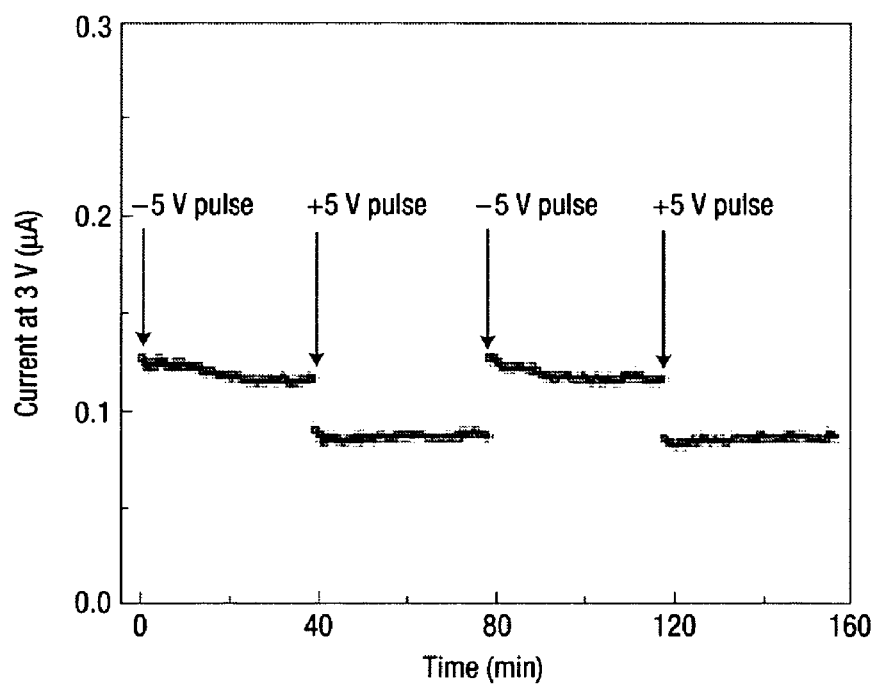
FIG. 9b is a plot of current versus time through the device of FIG. 3 during application of positive and negative voltage pulses through the device.

It has also been shown that the device current scales linearly with the well area. This confirms that the Si-molecule-SWNT junction in the well 18 is the dominant resistance path in the entire structure. The current density is calculated according to this linear relationship. The measured current density (mean value of hysteresis) at 1 V was ~12 A cm$^{-2}$ for Si-OPE-SWNT devices and ~72 A cm$^{-2}$ for the molecule-free (Si—H) devices. Although there are ~10$^{13}$ OPE-sized molecules per cm$^2$ in a grafted monolayer on silicon, it is perhaps impossible to estimate the number of contacted molecules in the well 18 because of the surface topology of the silicon at the molecular scale, and the unknown density of the SWNTs that actually make molecular contact within the well. The hysteresis in the I(V) curve is caused by a conductivity change that occurs under the high-voltage bias (>3 V). If the I(V) test is limited to low voltages (<2 V), no hysteresis is observed. In addition to scanning of high voltages, high-voltage pulsing has also been found to change the conductivity states of the devices. As shown in FIG. 9*a*, after a −5-V pulse for 1 sec, the conductivity state of the device is represented by the solid curve. When a +5-V pulse (1 sec) is then applied, the conduction state changed to that represented by the dashed curve in FIG. 9*a*. Owing to the difference in the conduction, these two states are denoted as the high-conductivity state and low-conductivity states, respectively, of the device. It has been found that these two conductivity states can be switched back and forth freely by selecting the corresponding voltage pulses. For all the junctions, negative biases always set the device 10 into a high-conductivity state, whereas positive bias resets the device into a low-conductivity state. There appears to be a lifetime of at least 72 hours at ambient temperature when set into a particular state. The conductivity state can be tested (read) many times in the 72-hour duration; no testing beyond 72 hours has bee conducted and no device testing has been conducted in air. This stable conductivity switching behavior makes it possible for the Si-molecule-SWNT junctions 10 to be used as non-volatile memories. This is demonstrated by the write-multiple-read-erase-multiple-read operations, as shown in FIG. 9*b*. The write-erase operations are performed by pulsing the device for 5 sec with −5 and +5 V, respectively. After each write or erase operation, the device state was read at 3 V and continuously monitored for 1,000 reading operations. FIG. 9*b* shows that the device 10 can be programmed to the high-conductivity state by a −5-V pulse or to the low-conductivity state by a +5-V pulse. It also shows that the memory is non-volatile and can be effectively read many times at a lower voltage (3 V). Efforts have been made to test the memory at higher speed, for example with shorter write-erase-read voltage pulses. When operated with 5-ms pulses for the write or erase operation, similar results have been demonstrated. Device 10 has also been investigated as to its resilience over consecutive write-erase operations. It has been experimentally demonstrated that approximately 1,200 write-erase operations can be performed before the two states become sufficiently close (loss of hysteresis) so that they became realistically indistinguishable.

Even though it is true that the observed on/off ratio (~30% change in hysteresis) is not pronounced and large ratios are advantageous, those of ordinary skill in the art will appreciate that larger on/off ratios are not always required. It will be appreciated that depending on the circuitry scheme and architecture, some memory effects with small on/off ratios can be useful for constructing large-array memory devices, such as in the case of magnetic random-access memory where the change in magnetic resistance ratios are only 25% when configured with a pass transistor and a bias at the magnetic tunnel junction. Moreover, owing to the large variety of variables in the devices 10, improvement in the on/off ratio can be expected.

Figure 10A:
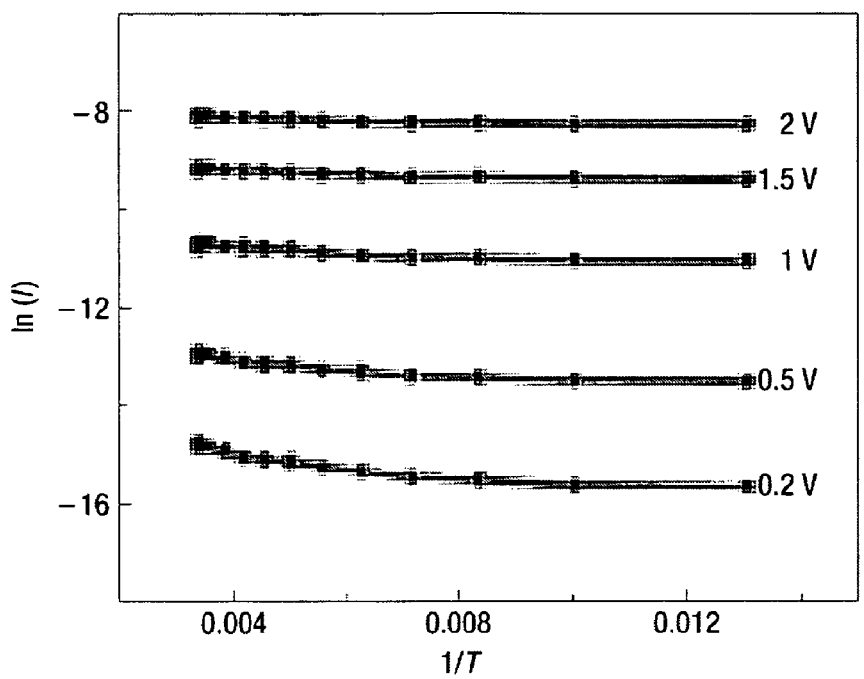
FIGS. 10a and 10b are Arrhenius plots of the I(V,T) properties of a device in accordance with one embodiment of the invention with respect to temperature variation, in the low-conductivity state and high-conductivity state, respectively.
Figure 10B:
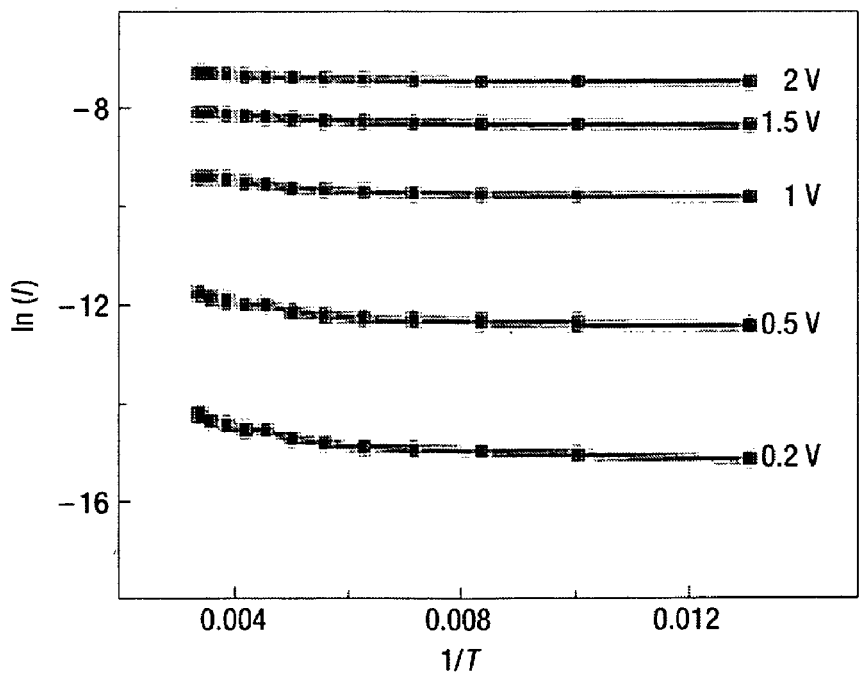
Figure 11A:
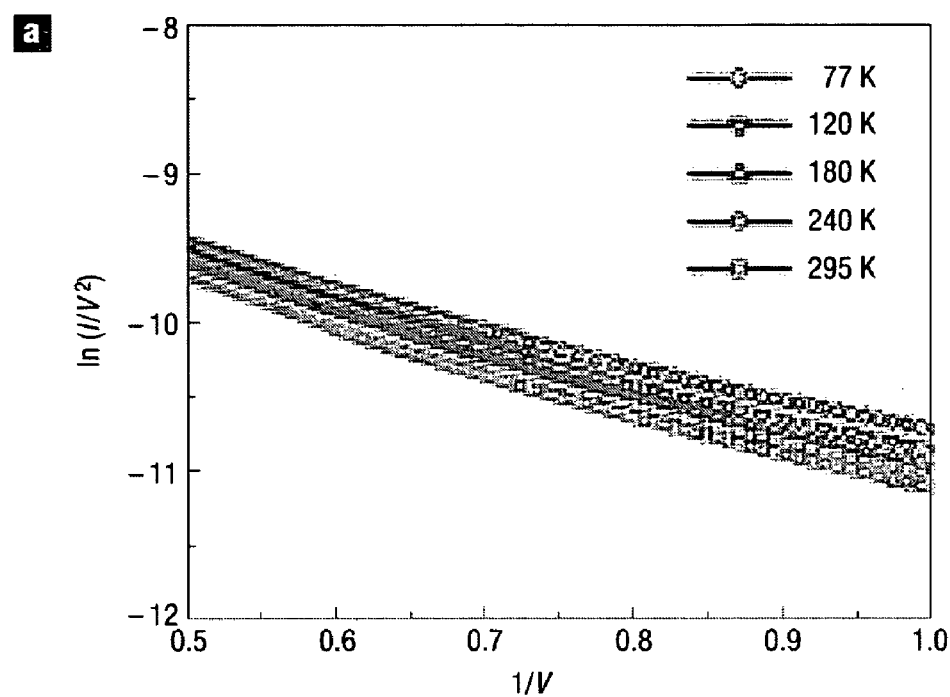
FIGS. 11a and 11b are plots demonstrating a fit with Fowler-Nordheim tunneling in a device in accordance with one embodiment of the invention in a low-conductivity state and a high-conductivity state, respectively.
Figure 11B:
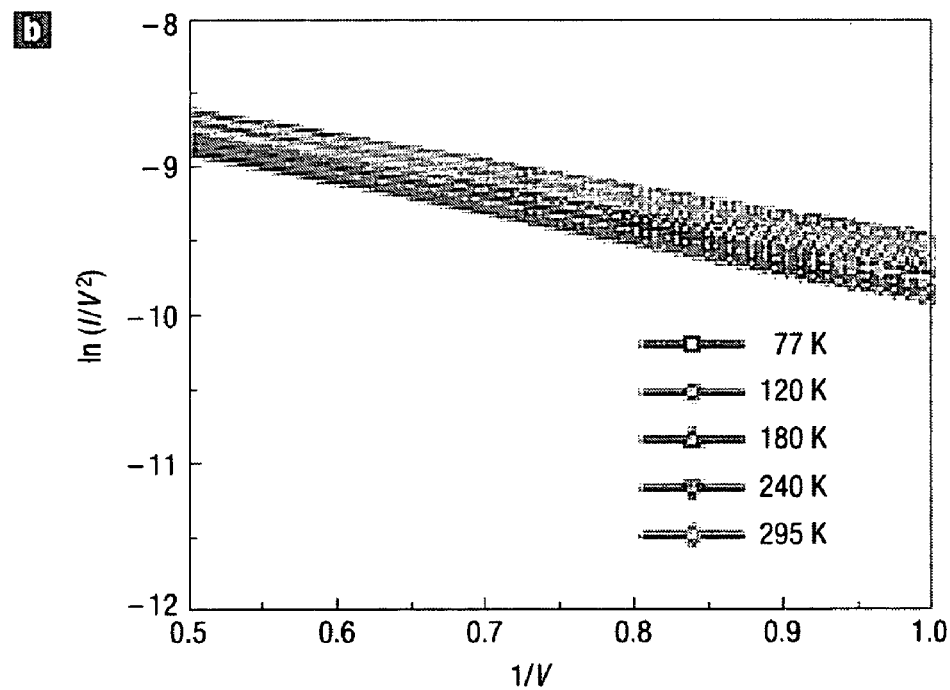

As it has been concluded that the observed memory effect is a molecule-based effect, the mechanism for the switching behavior is of interest. There are several mechanisms proposed for current transport involving molecular junctions. Most of these can be categorized into two distinct groups: a thermionic process that involves a thermal activation, and a tunneling process that does not involve thermal activation. Therefore, I(V,T) measurements have been performed on a Si-OPE-SWNT (5-µm-well) device for both the high-conductivity and the low-conductivity states. FIGS. 10*a* and 10*b* show the Arrhenius plots of the I(V,T) tests on device 10 in the low-conductivity and high-conductivity states. As is apparent from FIGS. 10*a* and 10*b*, it is clear that there is very little temperature dependence in either case. The thermal barrier heights according to the relationship of I ~exp(−φB/kT) (where φB is the barrier height and k is the Boltzmann constant) are determined to be less than 20 meV. Thus the current transport in the Si-OPE-SWNT device 10 is not a thermionic process. When ln(I/V2) is plotted as a function of 1/V, a linear relationship is observed, as shown in FIGS. 11*a* and 11*b*. FIG. 11*a* corresponds to device 10 in the low-conductivity state, and FIG. 11*b* corresponds to device 10 in the high-conductivity state. This is suggestive of a possible Fowler-Nordheim tunneling process through the molecular monolayer. However, other mechanisms are possible, such as: (i) tunneling through a Schottky barrier, or (ii) a process in which the hysteresis simply comes from the mechanical relays of individual SWNTs where the dangling or suspended SWNTs or the molecules might move under an external electric field so as to switch between two stable positions. These processes are, however, not seen with the arylalkane (FIG. 4*f*).

It is to be understood that the foregoing descriptions of the switching mechanism(s) responsible for the desirable operational qualities of devices in accordance with the present invention is speculative to some degree, and the foregoing descriptions should not be considered limiting with respect to the scope of the invention as defined in the appended claims.

Figure 4E:
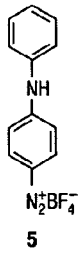
Figure 4F:
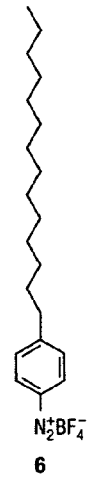

It is notable that in accordance with one aspect of the invention, all the conjugated molecules give a similar hysteretic performance in both magnitude and range; this is especially intriguing when considering the vast difference between the electrophilicity of the various OPEs (FIGS. 4a-4d) and even more so when comparing the OPEs to the aniline (FIG. 4e). It seems that the dominant requirement for the use of this approach is the assurance of a π-conjugated pathway between the Si and the SWNTs. Alkyl units such as shown in FIG. 4f and the hydride-passivated surface alone (Si—H) do not afford the hysteresis loop. This difference, in itself, does not suggest a mechanism, but only defines the properties. Furthermore, that a negative differential resistance was never observed, even in systems such using the molecule structure shown in FIG. 4b where negative differential resistance has been recorded on other metal-based assemblies, would support the notion that such effects are intimately associated with the substrate surface, that is Si versus Au, or more probably the entire device embodiment. For OPE-thiol assemblies on gold, conjugated molecules are prone to Au—S-aryl hybridization changes, resulting in switching owing to tilting of the molecules. However, in the Si-aryl systems in accordance with the present invention, there is no simple hybridization change available. Therefore, regardless of the precise mechanism, at this point it can only be concluded that the process is molecularly dependent requiring extended π-conjugation, temperature independent and tunneling in nature.

Device Fabrication Methods

The structures 10 in accordance with various embodiments of the invention have been fabricated on highly doped n-type Si substrates (As, <10.005 Ω cm) on the Si(100) face. A 200-nm-thick thermal oxide layer was formed on top of the substrate. Then a 20-nm Ti adhesion layer followed by a 200-nm Au layer is deposited using standard lithography and metallization processes to form the top metal pads. A second mask lithography step follows to pattern the wells far (300 µm) from the Au pads. The wells are circular with diameters of 5, 10, 15 or 20 µm. The wells were formed by 8-min wet etching in buffered oxide etch (J. T. Baker, 10:1, CMOS grade) affording the H-passivated Si layer. After drying with $N_2$ gas, the sample is immediately transferred to a glove box to perform the molecular assembly. The backside of the wafer is then sputter-coated with 200-nm Au at ~25° C. for use as the bottom contact (FIG. 5).

Molecular Assembly

OPE molecules shown in FIGS. 4a through 4d, an oligoaniline (FIG. 4e, or the tetradecylbenzene FIG. 4f were assembled in the wells on H-passivated silicon using known techniques. Devices with no molecules (Si—H surface) were also made and tested as control samples. When this assembly process is completed, the sample is removed from a dry box, rinsed with acetonitrile and dried with $N_2$.

Nanotube Purification

The raw high-pressure CO disproportionation SWNTs (commercially available from various sources) are wet baked at 225° C. for 18 hours with a flowing gas mixture of 20% $O_2$ in Ar (or air) passing through a water bubbler. The exposed iron is believed to be fully converted to $Fe_2O_3$. Sonication for ~15 min or prolonged stirring in concentrated HCl solution then follows to dissolve the iron. After filtration on top of a 1.0-µm-pore-size Teflon® membrane, the SWNTs are washed several times with deionized water and methanol, and dried under vacuum before their use in device assembly or functionalization.

Nanotube Assembly

Using a hand-held micropipette or microtransfer wire, a purified SWNT suspension (or purified then functionalized suspension) in chloroform (~1 mg ml$^{-1}$) is deposited onto the sample surface to cover the well region 18 and make the connection to the neighboring Au pads 16. The chloroform is evaporated.

Device Testing

Sample devices 10 have been tested in a variable-temperature probe station (Desert Cryogenics Π-prober 6 system) under a vacuum of less than $5 \times 10^{-6}$ torr. The direct-current (DC) I(V) data can be collected by a semiconductor parameter analyzer (e.g., Agilent 4155C). I(V,T) measurements may be taken with the same system as temperatures varied from 77 to 295 K.

Certain variations on the invention are contemplated. First, the substrate may not be limited to polished silicon wafers. It is believed that polished wafers of other materials may also be used as the substrate, provided that appropriate chemistry to graft the molecules exists.

Second, the process of grafting the molecules to the substrate is not limited to the Si-diazonium chemistry. Other chemistry processes may also apply if the materials system permits.

Third, the application of the 1D or 2D micro materials may not be limited to solvent evaporation process. They may be deposited in a solution by self-assembly or electrochemistry process.

Further, the described "top" contact (as this term has been applied herein) may be in other physical forms rather than the relatively "top" position. It could be in a physically bottom or lower or side position.

What is claimed is:

1. A method for establishing electronic junctions between molecules and at least two substantially non-metallic leads (electrodes), said method comprising:
    assembling molecules on to a substrate;
        wherein the molecules are covalently bound to the substrate though substrate-carbon bonds to form a molecule surface; and
        wherein the substrate comprises a first substantially non-metallic lead; and depositing a carbon source on to the molecule surface;
        wherein the carbon source comprises a second substantially non-metallic lead.

2. The method of claim 1, wherein the carbon source comprises single walled nanotubes.

3. The method of claim 1, wherein the carbon source comprises double walled nanotubes.

4. The method of claim 1, wherein the carbon source comprises triple walled nanotubes.

5. The method of claim 1, wherein the carbon source comprises multi walled nanotubes.

6. The method of claim 1, wherein the carbon source comprises functionalized nanotubes.

7. The method of claim 1, wherein the carbon source comprises functionalized nanotube bundles.

8. The method of claim 1, wherein the carbon source comprises mixtures of nanotube types.

9. The method of claim 1, wherein the carbon source comprises thin graphite sheets.

10. The method of claim 1, wherein the substrate comprises silicon, and the substrate-carbon bonds comprise silicon-carbon bonds.

11. The method of claim 10, wherein the silicon comprises a form selected from the group consisting of single crystal silicon, polysilicon, and amorphous silicon.

12. The method of claim 11, wherein the silicon comprises a form selected from the group consisting of p-doped silicon, n-doped silicon, and intrinsic silicon.

13. The method of claim 1, wherein the substrate comprises GaAs.

14. The method of claim 1, wherein the carbon source is deposited on to the molecule surface from a solution.

15. The method of claim 1, wherein the carbon source is deposited on to the molecule surface by an application of an electric field.

16. The method of claim 1, wherein the carbon source is deposited on to the molecule surface using molecular interactions between the carbon source and the molecule surface.

17. The method of claim 1, further comprising:
repeating the assembling and depositing steps numerous times to produce a memory array.

18. The method of claim 1, further comprising:
repeating the assembling and depositing steps numerous times to produce a logic array.

19. The method of claim 1, wherein the molecules comprise π-conjugated molecules.

20. The method of claim 1, wherein the substrate comprises a hydride-passivated surface.

* * * * *

UNITED STATES PATENT AND TRADEMARK OFFICE
CERTIFICATE OF CORRECTION

| | | |
|---|---|---|
| PATENT NO. | : 7,704,323 B2 | Page 1 of 1 |
| APPLICATION NO. | : 11/337456 | |
| DATED | : April 27, 2010 | |
| INVENTOR(S) | : James M. Tour et al. | |

It is certified that error appears in the above-identified patent and that said Letters Patent is hereby corrected as shown below:

Column 1, lines 15-18 should read as follows: --This invention was made with Government support under Grant Number DMR-0073046 awarded by the National Science Foundation, Grant Number 654198 awarded by the University of Washington via pass-through funding from the Department of Defense Air Force Office of Scientific Research grant number F49620-01-1-0364, Grant Number 68371 awarded by Texas A&M University via pass-through funding from the National Aeronautics and Space Administration grant number NCC-01-0203, and Grant Number NCC9-77 awarded by the National Aeronautics and Space Administration. The Government has certain rights in the invention,--.

The original text "The research and development related to this invention was funded at least in part by the U.S. Defense Advanced Research Projects Agency through the Air Force Office of Scientific Research." should be cancelled.

Signed and Sealed this
Twelfth Day of April, 2011

David J. Kappos
*Director of the United States Patent and Trademark Office*